(12) United States Patent
Mecchia et al.

(10) Patent No.: US 6,501,406 B1
(45) Date of Patent: Dec. 31, 2002

(54) DIGITAL FILTER

(75) Inventors: Alessandro Mecchia, Vimercate (IT); Germano Nicollini, Piacenza (IT); Carlo Pinna, Sassari (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/905,675

(22) Filed: Jul. 13, 2001

(51) Int. Cl.[7] .............................................. H03M 3/00

(52) U.S. Cl. ..................... 341/143; 341/118; 341/120; 700/313; 700/300

(58) Field of Search ................................ 341/143, 115, 341/120; 708/300, 313

(56) References Cited

U.S. PATENT DOCUMENTS

| 4,872,129 A | * 10/1989 | Pfeifer et al. ................ 708/313 |
| 4,999,798 A | * 3/1991 | McCaslin et al. ............ 708/313 |
| 6,057,793 A | 5/2000 | Gong et al. .................. 341/143 |
| 6,279,019 B1 | * 8/2001 | Oh et al. ..................... 708/300 |

OTHER PUBLICATIONS

Garcia, A. et al; "Pipelined Hogenauer CIC filters using field–programmable logic and residue number system". Acoustics, Speech and Signal Processing, 1998, Proceedings of the 1998 IEEE, International Conference on. vol.: 5, 1998. pp.: 3085–3088 vol.*

Candy, J.C., "Decimation for Sigma Delta Modultaion," *IEEE Trans. on Communications*, COM–34(1):72–76, Jan. 1986.

Hogenauer, E.B., "An Economical Class of Digital Filters for Decimation and Interpolation," *IEEE Trans. on Acoustics, Speech and Signal Processing*, ASSP–29(2):155–162, Apr. 1981.

Chu, S., "Multirate Filter Designs Using Comb Filters," *IEEE Trans. on Circuits and Systems*, CS–31(11):913–924, Nov. 1984.

* cited by examiner

*Primary Examiner*—Michael Tokar
*Assistant Examiner*—Linh V Nguyen
(74) *Attorney, Agent, or Firm*—Lisa K. Jorgenson; Robert Iannucci; Seed IP Law Group PLLC

(57) ABSTRACT

A digital decimation filter includes a set of cascaded integrator stages for generating a first signal comprised of bit words including a first number of bits as well as a set of cascaded derivative stages for receiving said first signal and generating therefrom an output comprised of bit words including a second number of bits. The second number of bits is smaller than said first number of bits and a bit discarding unit is located downstream of the integrator stages and upstream of the derivative stages for discarding a given number of least significant bits from the bit words of the first signal before this is received by the derivative stages. Said given number is defined as the difference between said first and said second number of bits.

12 Claims, 2 Drawing Sheets

DIGITAL FILTER

BACKGROUND OF THE INVENTION

1. Field of the Invention

The invention relates to digital filters and more specifically to digital decimation filters of the type currently referred to as Sinc-type digital decimation filters.

Such filters are currently used for performing a decimation action of the oversampled signal output from an analog/digital converter of the Sigma/Delta type.

Such a filter represents an optimal solution for decimation of such a signal due to its intrinsic simplicity and its low-pass filtering effect of the quantization noise in the signal. The designation "Sinc" derives from its transfer function in the frequency domain which is a power of the order N (N being the order the filter) of the function $sinc(f)=sin(f)/f$.

2. Description of the Related Art

A general review of decimation within the contest of Sigma/Delta modulation can be found in "Decimation for Sigma/Delta Modulation" by James C. Candy, *IEEE Trans. Commun.*, vol. COM-34, pp. 72–76, January 1986.

The general layout of decimation digital filter of the Sinc type provides for N integrators operating at the sampling frequency of the input signal $f_s$ being arranged in a cascade followed by N derivative units operating at the decimation frequency $f_d=f_s/M$. N is designated the order of the Sinc filter while M is the decimation factor.

In FIG. 1 a block diagram is shown of a Sinc digital filter of order N=3, where the integrator and derivative stages are designated I and D, respectively.

There, blocks labeled $z^{-1}$ (in practice registers) represent delays of one sample, while each summation block implements a modulus arithmetic function (that is in the case of overflow the result is the remainder of the true value.

The transfer function $H_P$ of a digital Sinc filter of order N and decimation factor M at the frequency $f_s$ simply derived from the transfer functions $H_I$ of integrators I and the transfer functions $H_D$ of derivative units D.

$$H_I(z)=z^{-1}/(1-z^{-1})$$

$$H_D(z)=1-z^{-M}$$

$$H_P(z)=H_I^N \cdot H_D^N=z^{-N}\cdot[(1-z^{-M})/(1-z^{-1})]^N$$

Specifically, the maximum gain of the transfer function $H_P$ occurs for de values and is equal to $M^N$.

Properly implementing the structure shown in FIG. 1 requires the word length of each stage to be adequately selected in order to avoid overflow phenomena which would have a disruptive effect on the signal. Consequently, if b denotes the word length at the filter input, the required bit number does not need to be greater than:

$$n=b+\lceil N\cdot\log_2(M)\rceil$$

Using n bit words in all the stages of the filter ensures that no overflow will take place and that, similarly, no quantization noise will be introduced in addition to the quantization noise in the input signal.

However, the fact has to be taken into account that the number of bits $b_u$ in the output words from the filter (i.e., the output word length) is specific to the general design and is usually less than n: $b_u=n-k$. Therefore, the output word from the filter must be diminished of the k least significant bits. This can be done either by implementing all the filter stages with n bit words while subsequently diminishing the output word or (with the main aim of reducing the chip area requirements) by diminishing the signal word also at intermediate points within the filter. This is usually done with a variable criterion by adopting error-minimizing criteria in such a way to obtain $b_u$ bit word at the output of the filter.

A simple solution known in the art provides for the 2N integration and derivative stages of the Sinc filter to be implemented by resorting to n bit words by effecting truncation or rounding-off to the $b_u$ bits of the output word by simply discarding the k least significant bits from the filter output or, alternatively, by using them for rounding-off the output word. In such a way the filter does not introduce any intermediate truncation or rounding error, while a truncation error $q<2^{-(n-k)}$ or rounding error $q<2^{-(n-k+1)}$ is introduced at the filter output.

Articles such as "An Economical Class of Digital Filters for Decimation and Interpolation" by Eugene B. Hogenauer, *IEEE Trans. on Acoustics, Speech and Signal Processing*, vol. ASSP-29, no. 2, pp. 155–162, April 1981 or "Multirate Filter Designs Using Comb Filters" by Shuni Chu et al., *IEEE Trans. Circuits and Sys.*, vol. CS-31, pp. 913–924, November 1984 disclose methods which rely on the q error being in any case present at the filter output. Essentially, the methods disclosed in the referenced articles distribute truncation to k bits within the filter over the 2N derivative and integrator stages by adopting the empirical criterion of avoiding generation of an additional error higher than the final q truncation error. A specific example of this is described in the captioned article by Hogenauer.

The purpose of such methods is primarily reducing the components and the chip area required for implementing the filter. Such a reduction is achieved by implementing certain stages with a word length which is less than n bits and, therefore, with smaller adder blocks and registers. These methods, however, do not properly take into account the characteristics of the input signal and specifically the fact that the bandwidth of such an oversampled signal is usually much smaller than $f_s/2$.

Also, in U.S. Pat. No. 6,057,793 to Dupuis et al. a digital decimation filter and method are disclosed wherein the decimation filter includes a front-end portion which receives the digital data at a relatively high sample rate. The first stage of the front-end portion involves decimation and a latter stage or stages of that portion involves combination of interpolation and decimation. The cumulative effect is to reduce the sample rate of the incoming data stream to a value which can be more easily manipulated by the back-end portion of the digital decimation filter.

SUMMARY OF THE INVENTION

An embodiment of the present invention improves the solution for eliminating the k least significant bits in a Sinc decimation filter by achieving advantages both in terms of chip area and as regard performance.

Essentially, in the arrangement of one embodiment of the invention reduction of k least significant bits takes place by truncating all the k least significant bits at the input of the first derivative unit, that is downstream of the cascaded integrators and upstream of the cascaded derivative units. In that way, all the derivative stages operate with n−k bit words.

In addition to reducing chip area and implementation complexity, in the current case of a suitably oversampled signal such a solution also ensures reduction of the quantization noise in the useful bandwidth of the signal thus leading to an improvement of the signal-to-noise ratio.

Having regard to the exceptions made on the characteristics of the input signal to the filter, the solution can be regarded as an optimal one, in that it ensures a signal-to-noise performance improved over any other truncation or rounding-off solution of the k least significant bits.

BRIEF DESCRIPTION OF THE DRAWINGS

The invention will now be further described, by way of example only, with reference to the drawings annexed herewith. Therein.

DETAILED DESCRIPTION OF THE INVENTION

Figure 1:
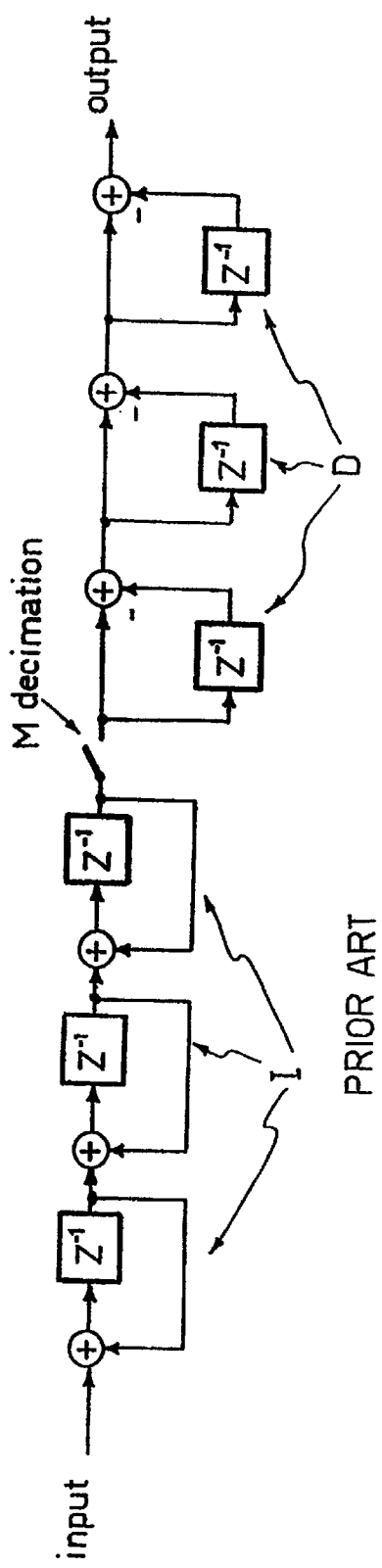
FIG. 1, relating to the prior art, was already described in the foregoing.
Figure 2:
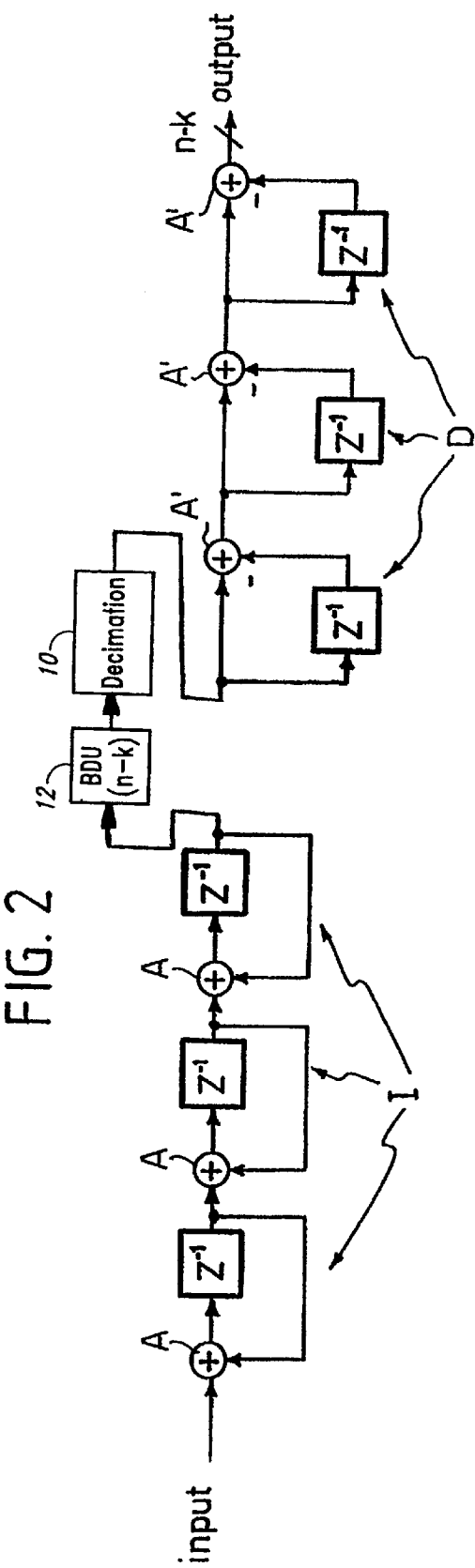
FIG. 2 is a block diagram showing the basic arrangement of the filter according to an embodiment of the invention.

In the block diagram of FIG. 2 the general layout of a digital decimation filter of the Sinc type is shown including N cascaded integrators I operating at a frequency $f_s$ followed by N cascaded derivative stages D intended to operate at the decimation frequency $f_d = f_s/M$. A decimation stage 10 is positioned between the integrators I and the derivative stages D to implement the decimation of the sampling frequency $f_s$ by M to produce the decimation frequency $f_d$.

In the embodiment shown N is equal to three but N can be any number.

Integrators I are implemented by providing for the output signal of the respective delay unit $z^{-1}$ to be fed back to the input of the respective modulo-adder A. There the feedback signal is added to the input signal to the stage to yield the input signal to the delay stage.

Conversely, in each derivative unit D the input signal to the stage is fed both to one input of the respective modulo-adder A' and to the input of the delay unit $z^{-1}$. The output from the delay unit then fed with an inverted sign to the other input of the respective modulo-adder A'.

All of the foregoing corresponds to criteria which are well known to those skilled in the art of digital filters, whereby no further detailed explanation needs be provided in respect of the structure of the I and D stages shown herein.

A significant feature in the arrangement of FIG. 2 lies in that a bit discarding unit (BDU) 12 is positioned downstream of integrators I and upstream of derivative units D, that is in a position intermediate the output of the last cascaded integrator I and the input of the first derivative units D. The bit discarding unit 10 discards the k least significant bits of the signal output by the last of the integrators I.

This is preferably before the intermediate decimation stage 12 where M-order decimation is carried out.

As a consequence, words having a bit length equal to n–k are fed towards the cascaded derivative units D (that is, in the exemplary embodiment shown herein, towards the decimation step M).

Such an arrangement provides a number of significant advantages.

All of the N derivative units D operate with a word length equal to n–k bits. Complexity of adders A' and of the registers comprising delay units $z^{-1}$ is reduced. Reduction of chip area may thus be achieved with respect to those solutions providing for truncation only at the output stage and similar solutions known in the art.

All the derivative units D have same dimensions, whereby the respective cascade can be simply implemented by replicating a single derivative cell N times. This represents a simplification with respect to those prior art solutions providing for different derivative units having different dimensions.

The signal-to-noise ratio of the filter in the frequency band [0, $f_l$] with $f_l \ll f_s$ is optimum, that is cannot be bettered by any other method of reducing the least significant bits in the output word. The value of $f_l$ can be determined by way of comparison with other methods.

Figure 3:
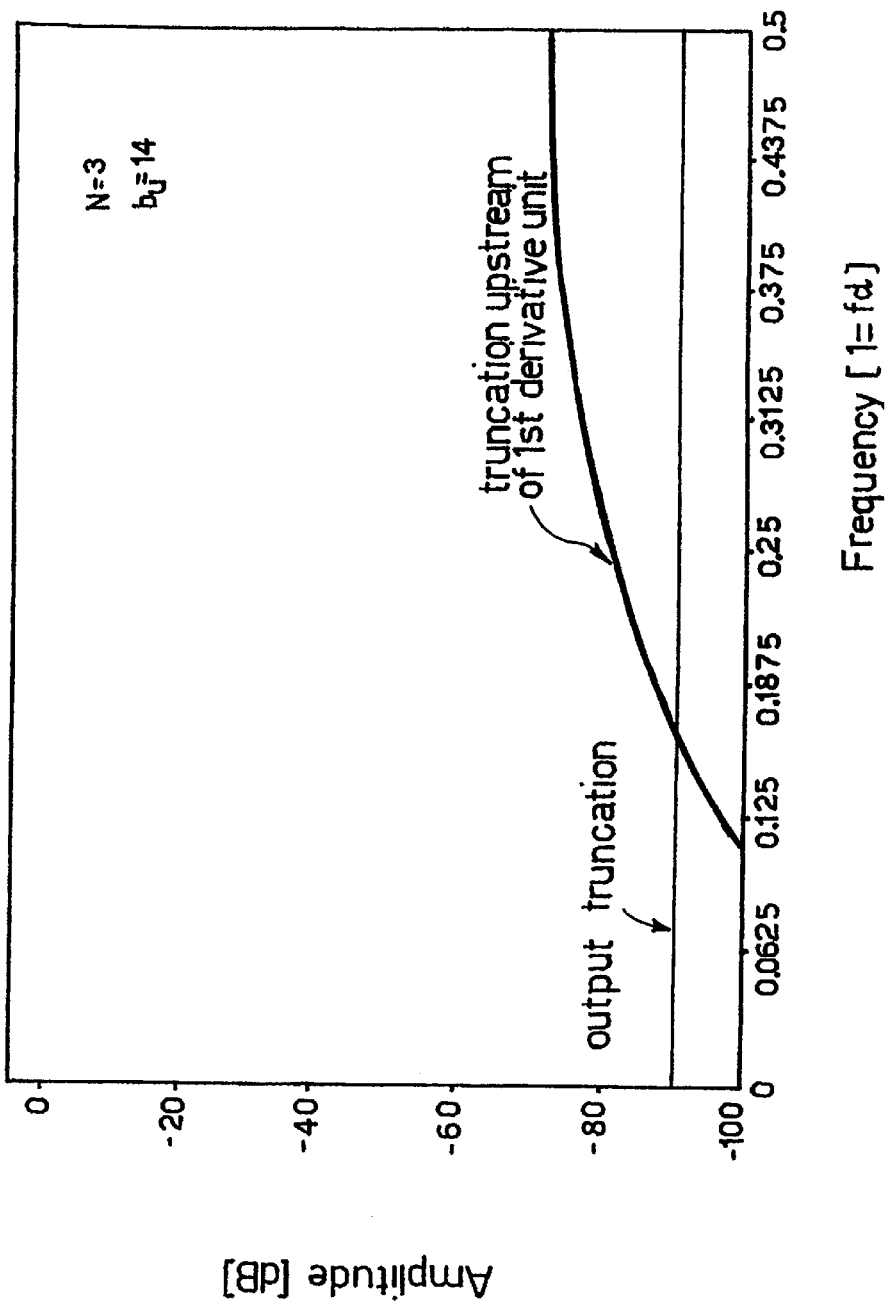
FIG. 3 is a diagram wherein the quantization noise performance of a filter according to the invention is compared with the performance of a filter of the prior art.

The diagram of FIG. 3 is a comparison between the frequency behavior of quantization noise due to k-bit truncation of the output word (which for a complex signal is essentially a white noise) and the corresponding behavior in the case of the arrangement of FIG. 2.

Specifically, in the diagram of FIG. 3 the quantization noise level (amplitude in dB–y scale) for the first half-lobe of a Sinc decimation digital filter with N=3 and $b_u$=14 is plotted against frequency [1=$f_d$] in the case of truncation at the output and in the case of the invention.

In this latter case, the noise in question, while being essentially white noise at the injection point is subsequently subject to shaping by the N derivatives units D.

The quantization noise in the arrangement of the invention is thus lower at low frequencies and the cross point of the two noise levels $f_l$ can be easily determined to be equal to:

$$f_l = f_s/6 \cdot M = f_D/6$$

where M is the decimation factor (with no dependency on the filter order N).

The value of $f_l$ can be determined by equaling the integrals of the two quantization noise curves shown calculated between 0 and $f_l$. Since $f_i < f_l$ one can simply consider $f_i$ as an upper bandwidth limit for which the arrangement of the invention gives a better signal-to-noise with respect to k-bit truncation directly effected on the output word.

It is to be understood that the invention shown and described is to be taken as a presently preferred embodiment. Various modifications and changes may be made to the design structure as would be obvious to a person skilled in the art having the benefit of this disclosure. The specification and drawings are therefore to be regarded in an illustrative rather than a restrictive sense.

What is claimed is:

1. A digital decimation filter including:

a set of cascaded integrator stages for generating a first signal comprised of bit words including a first number of bits;

a set of cascaded derivative stages for receiving said first signal and generating therefrom an output signal comprised of bit words including a second number of bits, said second number of bits being smaller than said first number of bits; and a bit discarding unit located downstream of said set of cascaded integrator stages and upstream of said set of cascaded derivative stages for discarding a given number of least significant bits from the bit words of said first signal before said first signal is received by said set of cascaded derivative stages, said given number being defined as the difference between said first and said second number of bits, wherein each of the cascaded integrator stages of the digital decimation operates on a first word length corresponding to the first number of bits and each of the cascaded derivative stages of the digital decimation filter operates on a second word length corresponding to the second number of bits.

2. The digital filter of claim 1, further including a decimation stage to effect decimation with a given decimation factor of the bit words of said first signal before said first signal is received by said set of cascaded derivative stages.

3. The digital filter of claim 2, wherein said bit discarding unit is located upstream of said decimation stage.

4. The digital filter of claim 1, wherein said integrator stages all operate on bit words including said first number of bits.

5. The digital filter of claim 1, wherein said derivative stages all operate on bit words including said second number of bits.

6. The digital filter of claim 1, wherein said integrator stages each include:
 a delay unit for receiving a given input signal and generating therefrom a delayed signal, and
 a modulo-adder for receiving a respective input signal to be integrated as well as said delayed signal and generating therefrom said given input signal for the delay unit.

7. The digital filter of claim 1, wherein said derivative stages each include:
 a modulo-adder for receiving a respective input signal to be subjected to a derivative function, and
 a delay unit for receiving said respective input signal to be subjected to a derivative function and generate therefrom a respective delayed output signal, wherein said respective input signal to be subjected to a derivative function and said respective delayed output signal are added in said modulo-adder.

8. The digital filter of claim 2, wherein said integrator stages operate with a sample rate corresponding to a first frequency ($f_s$) said filter being configured to generate an output signal within a band having an upper frequency limit, wherein said upper frequency limit is defined by the formula:

$$f_i = f_s/6 \cdot M$$

wherein $f_i$ is said upper frequency limit, $f_s$ is said first frequency, and M is the given decimation factor of said decimation stage.

9. A digital decimation filter including:
 a set of cascaded integrator stages for generating a first signal comprised of bit words including a first number of bits, where each of the cascaded integrator stages in the digital decimation filter has a word length equal to the first number of bits;
 a set of cascaded derivative stages for receiving said first signal and generating therefrom an output signal comprised of bit words including a second number of bits, said second number of bits being smaller than said first number of bits, where each of the cascaded derivative stages in the digital decimation filter has a word length equal to the second number of bits;
 a bit discarding unit located downstream of said set of cascaded integrator stages and upstream of said set of cascaded derivative stages for discarding a given number of least significant bits from the bit words of said first signal before said first signal is received by said set of cascaded derivative stages, said given number being defined as the difference between said first and said second number of bits; and
 a decimation stage to effect decimation with a given decimation factor of the bit words of said first signal before said first signal is received by said set of cascaded derivative stages, wherein said integrator stages operate with a sample rate corresponding to a first frequency ($f_s$) said filter being configured to generate an output signal within a band having an upper frequency limit, wherein said upper frequency limit is defined by the formula:

$$f_i = f_s/6 \cdot M$$

wherein $f_i$ is said upper frequency limit, $f_s$ is said first frequency, and M is the given decimation factor of said decimation stage.

10. The digital filter of claim 9, wherein said bit discarding unit is located upstream of said decimation stage.

11. A digital decimation filter including:
 a set of cascaded integrator stages for generating a first signal comprised of bit words including a first number of bits, where all of the cascaded integrator stages in the digital decimation filter has a word length equal to the first number of bits;
 a set of cascaded derivative stages for receiving said first signal and generating therefrom an output signal comprised of bit words including a second number of bits, said second number of bits being smaller than said first number of bits, where all of the cascaded derivative stages in the digital decimation filter has a word length equal to the second number of bits;
 a bit discarding unit located downstream of said set of cascaded integrator stages and upstream of said set of cascaded derivative stages for discarding a given number of least significant bits from the bit words of said first signal before said first signal is received by said set of cascaded derivative stages, said given number being defined as the difference between said first and said second number of bits; and
 a decimation stage to effect decimation with a given decimation factor of the bit words of said first signal before said first signal is received by said set of cascaded derivative stages, wherein said bit discarding unit is located upstream of said decimation stage and said integrator stages operate with a sample rate corresponding to a first frequency ($f_s$) said filter being configured to generate an output signal within a band having an upper frequency limit, wherein said upper frequency limit is defined by the formula:

$$f_i = f_s/6 \cdot M$$

wherein $f_i$ is said upper frequency limit, $f_s$ is said first frequency, and M is the given decimation factor of said decimation stage.

12. A method of digital decimation filtering, comprising:
 generating a first signal from an input signal using a set of integration stages, the first signal being comprised of bit words including a first number of bits and where all of the integration stages of a digital decimal filter have a first word length corresponding to the first number of bits;

generating an output signal from the second signal using a set of derivative stages, the output signal being comprised of bit words including a second number of bits that is smaller than the first number of bits, where all of the derivative stages of the digital decimal filter have a second word length corresponding to the second number of bits; and discarding a given number of least significant bits from the bit words of the first signal before the first signal is received by the derivative stage, the given number being defined as the difference between said first and said second number of bits.

* * * * *